United States Patent
Sato

(10) Patent No.: US 11,502,600 B2
(45) Date of Patent: Nov. 15, 2022

(54) POWER SUPPLY CONTROL CIRCUIT

(71) Applicant: Winbond Electronics Corp., Taichung (TW)

(72) Inventor: Takahiko Sato, Yokohama (JP)

(73) Assignee: WINDBOND ELECTRONICS CORP., Taichung (TW)

(*) Notice: Subject to any disclaimer, the term of this patent is extended or adjusted under 35 U.S.C. 154(b) by 0 days.

(21) Appl. No.: 17/368,081

(22) Filed: Jul. 6, 2021

(65) Prior Publication Data

US 2022/0014096 A1 Jan. 13, 2022

(30) Foreign Application Priority Data

Jul. 7, 2020 (JP) .............................. JP2020-116915

(51) Int. Cl.
*H02M 3/155* (2006.01)
*H03K 19/20* (2006.01)

(52) U.S. Cl.
CPC ............. *H02M 3/155* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 7,679,412 B2* | 3/2010 | Ogiwara | ............... | G11C 5/143 327/143 |
| 7,816,957 B2 | 10/2010 | Chen | | |
| 8,351,174 B1* | 1/2013 | Gardner | ............... | H02H 3/243 361/92 |
| 9,190,120 B2* | 11/2015 | Shim | ...................... | G11C 16/30 |
| 10,090,025 B2* | 10/2018 | Elbaum | ................... | G06F 21/71 |

FOREIGN PATENT DOCUMENTS

| | | |
|---|---|---|
| CN | 102377416 A | 3/2012 |
| CN | 109347314 A | 2/2019 |
| JP | 2009-87398 A | 4/2009 |
| TW | I369842 B | 8/2012 |
| TW | I543527 B | 7/2016 |

* cited by examiner

*Primary Examiner* — Jeffery S Zweizig
(74) *Attorney, Agent, or Firm* — Birch, Stewart, Kolasch & Birch, LLP

(57) ABSTRACT

A power supply control circuit that is able to reliably discharge to the internal power supply, even when the external power supply is cut off instantaneously. The power supply control circuit includes a voltage detection unit, an internal power supply generation unit, and a control unit. The voltage detection unit detects the voltage of the external power supply. The internal power supply generation unit generates the internal power supply, according to the external power supply. The control unit controls the discharging to the internal power supply according to at least the second control signal among the first control signal and the second control signal, when the detected voltage of the external power supply drops below the predetermined value.

17 Claims, 9 Drawing Sheets

POWER SUPPLY CONTROL CIRCUIT

CROSS REFERENCE TO RELATED APPLICATIONS

This application claims priority of Japan Patent Application No. 2020-116915, filed on Jul. 7, 2020, the entirety of which is incorporated by reference herein.

BACKGROUND OF THE INVENTION

Field of the Invention

The present disclosure is related to power supply control circuits.

Description of the Related Art

Conventional power supply control circuits have a power-on reset circuit (e.g., Patent I to Patent III). The power-on reset circuit is designed so that the operation of other circuits remains in the reset state, and the reset state is released after ensuring the operation of the power supply, in order to avoid being unable to ensure the status of the power supply voltage after the external power supply has been applied and thereby causing the operation of these other circuits become unstable.

In addition, when the internal power supply used for driving other circuits is generated by the external power supply, it is necessary to stop the operation of these other circuits when the external power supply is cut off. Hence, common power supply control circuits are designed to discharge to the internal power supply when the external power supply is cut off.

Such power supply control circuits are designed to accomplish certain tasks. For example, when the voltage of the external power supply gradually decreases to the grounding voltage (0V) due to the external power supply being cut off, the circuit driven by the external power supply may discharge to the internal power supply.

Prior Arts

Patent I: CN102377416A
Patent II: U.S. Pat. No. 7,816,957
Patent III: TW1543527

When the voltage of the external power supply instantaneously drops to the grounding voltage due to the external power supply being cut off, however, it becomes difficult to discharge to the internal power supply, because the operation of the circuit used for discharging to the internal power supply instantaneously stops. Under these conditions, there is a circuit that keeps operating not only after the external power has been cut off, but also when the external power supply is restored, so that a power-on reset is not performed when the external power supply is restored. Therefore, because the circuits that perform a power-on reset may be mixed together with circuits that do not perform a power-on reset when the external power supply is restored, the operation between these circuits may be abnormal, and the device on which these circuits are deployed may even malfunction.

In view of the problems described above, the present disclosure is directed to providing a power supply control circuit that allows the reliable discharging of power to the internal power supply even when the external power supply is instantaneously cut off.

BRIEF SUMMARY OF THE INVENTION

To solve the problem described above, the present disclosure provides a power supply control circuit. The power supply control circuit includes a voltage detection unit, an internal power supply generation unit, and a control unit. The voltage detection unit detects the voltage of the external power supply. The internal power supply generation unit generates the internal power supply, according to the external power supply. The control unit controls the discharging of power to the internal power supply according to at least the second control signal among the first control signal with the voltage of the external power supply and the second control signal with the voltage of the internal power supply, when the detected voltage of the external power supply drops below the predetermined value.

According to the present disclosure, since the internal power supply discharges according to the second control signal with the voltage of the internal power supply, discharging to the internal power supply according to the second control signal is allowed before the internal power supply runs out of power, even when the external power is cut off instantaneously. Therefore, reliably discharging to the internal power supply is allowed, even when the external power is cut off instantaneously.

According to the power supply control circuit of the present disclosure, reliably discharging to the internal power supply is allowed, even when the external power is cut off instantaneously.

BRIEF DESCRIPTION OF THE DRAWINGS

The present disclosure can be more fully understood by reading the subsequent detailed description and examples with references made to the accompanying drawings, wherein:

FIG. 3 (b) is a time-series chart showing the variation of the voltage of the first control signal and the second control signal when the voltage of the external power supply gradually decreases:

FIG. 4 (b) is a time-series chart showing the variation of the voltage of the first control signal and the second control signal when the voltage of the external power supply drops instantaneously;

FIG. 6 (b) is a time-series chart showing the variation of the voltage of the first control signal and the second control signal when the voltage of the external power supply gradually decreases;

FIG. 7 (b) is a time-series chart showing the variation of the voltage of the first control signal and the second control signal when the voltage of the external power supply drops instantaneously;

FIG. 9 (b) is a time-series chart showing the variation of the voltage of the first control signal and the second control signal when the voltage of the external power supply drops instantaneously.

DETAILED DESCRIPTION OF THE INVENTION

The power supply control circuit in the embodiments of the present disclosure is described in detail with reference to the drawings. It should be noted that the embodiments are just examples, and the present disclosure is not limited thereto.

In addition, terms such as "first," "second," "third," etc., are used for distinguishing an element from other elements, and not for limiting the number, order, or prioritization of the elements. For example, the recitation of "first element" and "second element" does not imply that only "first element" and "second element" are allowed to be used, and not that "first element" must be prior to "second element".

Figure 1:
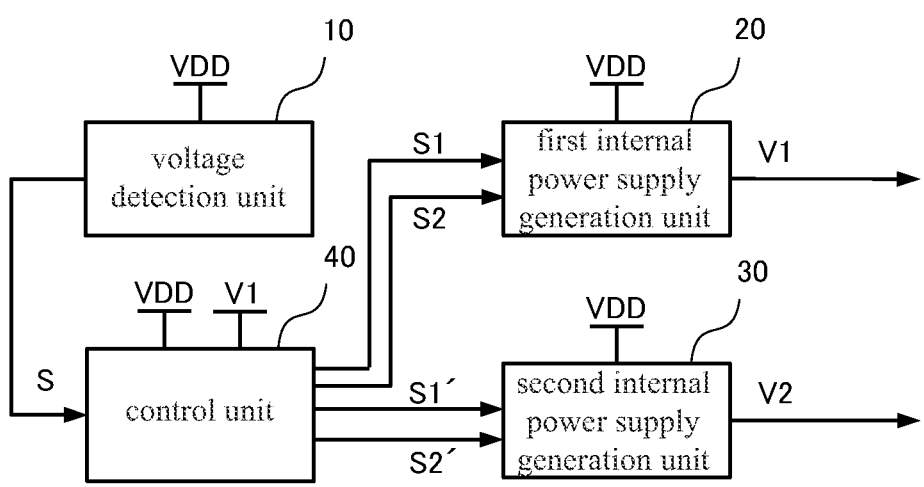
FIG. 1 is a block diagram showing a structural example of a power supply control circuit in the first embodiment of the present disclosure.

FIG. 1 is a block diagram showing a structural example of a power supply control circuit in the first embodiment of the present disclosure. The power supply control circuit is provided with a voltage detection unit 10, a first internal power supply generation unit 20, a second internal power supply generation unit 30, and a control unit 40. Moreover, the voltage detection unit 10, the first internal power supply generation unit 20, the second internal power supply generation unit 30, and the control unit 40 are each supplied with a voltage VDD from the external power supply respectively. In addition, the first internal power supply generation unit 20 and the second internal power supply generation unit 30 each serve as an example of an "internal power supply generation unit" in the present disclosure.

The instance of discharging to the first internal power supply is hereby described as an example in this embodiment.

This power supply control circuit may be deployed on any electronic device, including memory devices like DRAM (Dynamic Random Access Memory). Such memory devices may have several internal power supply units with different voltages, so as to optimize power consumption and speed performance. Moreover, the memory device used in the recently used IoT (Internet of Things) edge devices (e.g., a smart phone) may operate in short time periodically. In view of the standby period during which no operation is performed is longer hereby, it is quite effective to cut off the power supply during the standby period, in terms of reducing power consumption of the memory device.

Furthermore, in such memory devices, the power input current or the standby leakage current will increase if the coupling capacitance increases, so they are less preferable. On the other hand, the slew rate of the provided electrical signal will increase (i.e., the external power supply will turn on or off instantaneously) if the coupling capacitance decreases. Therefore, in order to perform a power-on reset for the circuits in the memory device, it is required to allow discharging to the internal power supply reliably even when the external power supply is cut off.

Hence, when a power supply control circuit in this embodiment is deployed in the memory device, discharging reliably to the internal power supply is allowed even when the external power supply is instantaneously cut off. Since it is permitted to reliably perform a power-on reset of the circuits in the memory device, this embodiment is better.

Figure 3:
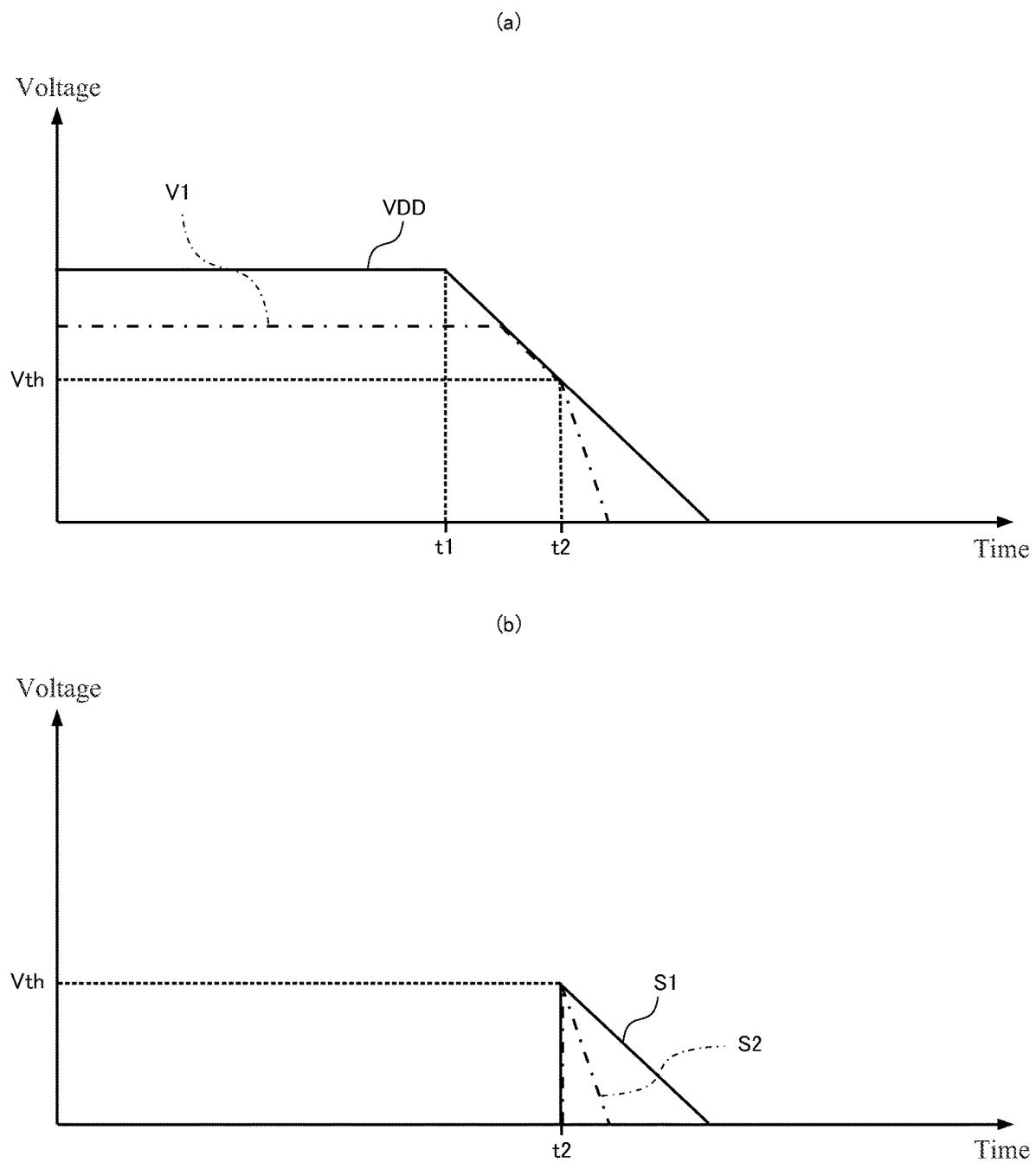
FIG. 3 (a) is a time-series chart showing the variation of the voltage of the first internal power supply when the voltage of the external power supply gradually decreases.

The voltage detection unit 10 detects the voltage VDD of the external power supply. Additionally, the voltage detection unit 10 determines whether the detected voltage VDD of the external power supply is higher than a predetermined threshold voltage Vth (as shown in FIG. 3). Additionally, the voltage detection unit 10 output the detected voltage signal S with voltage VDD (with the same potential as the voltage VDD's potential) to the control unit 40 when the voltage detection unit 10 determines that the detected voltage VDD of the external power supply is below the threshold voltage Vth. Moreover, the voltage detection unit 10 may detect the circuit composition from the conventional voltage.

The first internal power supply generation unit 20 generates the first internal power supply according to the external power supply. Therefore, the first internal power supply is provided with voltage V1 (e.g., V1<VDD). Additionally, the first internal power supply generation unit 20 supplies the generated first internal power supply to other circuits (not shown in drawings) driven by the first internal power supply. Furthermore, the first internal power supply generation unit 20 may also be provided with a level converter or a control circuit that changes the level of the voltage V1 for the circuits supplied with the first internal power supply.

The second internal power supply generation unit 30 generates the second internal power supply according to the external power supply. The second internal power supply hereby may also be provided with, for example, a voltage V2 (e.g., V2>VDD) that is higher than the voltage V1 of the first internal power supply. Additionally, the second internal power supply generation unit 30 supplies the generated second internal power supply to other circuits (not shown in drawings) driven by the second internal power supply. Furthermore, the second internal power supply generation unit 30 may also be provided with a level converter or a control circuit that changes the level of the voltage V2 for the circuits supplied with the second internal power supply.

The control unit 40 controls the discharging to the first internal power supply according to at least the second control signal S2 among (i) the first control signal S1 with the voltage VDD of the external power supply and (ii) the second control signal S2 with the voltage of the first internal power supply (the internal power supply), when the detected voltage VDD of the external power supply drops below the threshold voltage Vth. Moreover, the threshold voltage Vth is an example of the "predetermined value" in the present disclosure.

Figure 2:
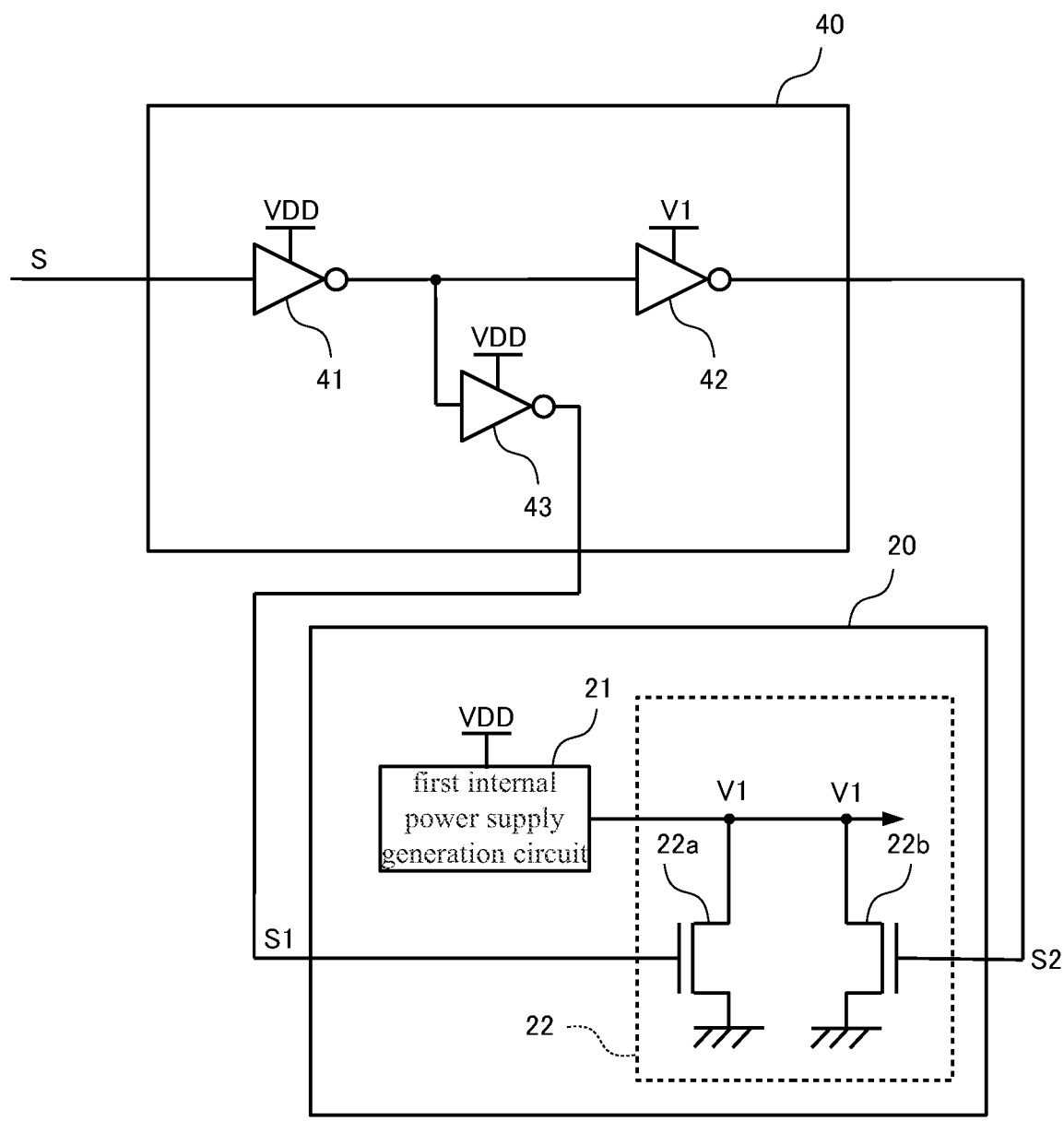
FIG. 2 is a schematic diagram showing a structural example of the first internal power supply generation unit and the control unit in the power supply control circuit in the first embodiment of the present disclosure.

FIG. 2 is a schematic diagram showing a structural example of the first internal power supply generation unit 20 and the control unit 40 in the power supply control circuit in this embodiment. The first internal power supply generation unit 20 may be provided with (i) a first internal power supply generation circuit 21 that generates the first internal power supply circuit according to the external power supply and (ii) a switch unit 22 connected between the first internal power supply (the internal power supply) and the ground. Moreover, the switch unit 22 is an example of the "first switch unit" in the present disclosure.

The first internal power supply generation circuit 21 may also, for example, supply the first internal power supply generated by decreasing the voltage VDD to the voltage V1 using a voltage stabilizer to other circuits. Additionally, the first internal power supply generation circuit 21 may also be composed of conventional internal power supply generation circuits.

The switch unit 22 may also be provided with an N-type MOSFET (Metal-Oxide-Semiconductor Field Effect Transistor) 22a that is connected between the first internal power supply (the internal power supply) and the ground, and that is turned on by the input of the first control signal S1 when the voltage VDD of the external power supply drops below the threshold voltage Vth (the predetermined value). Therefore, a current path from the first internal power supply to the ground through the MOSFET 22a can be formed by the input of the first control signal S1 when the voltage VDD of the external power supply drops below the threshold voltage Vth. Moreover, the MOSFET 22a is an example of the "second transistor" in the present disclosure.

In this embodiment, the drain of the MOSFET 22a is connected to the output voltage V1 of the first internal power supply generation circuit 21. Additionally, the source of the MOSFET 22a is connected to the ground. Furthermore, the gate of the MOSFET 22a will be applied with the first control signal S1 that is outputted by the control unit 40.

In addition, the switch unit 22 may also be provided with an N-type MOSFET 22b that is connected between the first internal power supply (the internal power supply) and the ground, and that is turned on by the input of the second control signal S2 when the voltage VDD of the external power supply drops below the threshold voltage Vth (the predetermined value). Therefore, a current path from the first internal power supply to the ground through the MOSFET 22b can be formed by the input of the second control signal S2 when the voltage VDD of the external power supply drops below the threshold voltage Vth. Moreover, the MOSFET 22b is an example of the "first transistor" in the present disclosure.

In this embodiment, the drain of the MOSFET 22b is connected to the output voltage V1 of the first internal power supply generation circuit 21. Additionally, the source of the MOSFET 22b is connected to the ground. Furthermore, the gate of the MOSFET 22b will be applied with the second control signal S2 that is outputted by the control unit 40.

The control unit 40 may also be provided with a first inverter 41 that outputs the reverse signal which is logically inverted from the detected voltage signal S using the external power supply (the signal with the voltage of the external power supply), and a second inverter 42 that outputs the second control signal S2 which is logically inverted from the reverse signal using the first internal power supply (the internal power supply). Therefore, the control unit 40 can, for example, output the second control signal S2 at the high level when the detected voltage signal S is at the high level. Additionally, the signal at the low level is inputted into the second inverter, and the second control signal S2 at the high level is outputted from the second inverter 42, when the voltage VDD of the external power supply is at the ground level. Therefore, the control unit 40 can output the second control signal S2 at the high level even when the voltage VDD of the external power supply is at the ground level.

In addition, the control unit 40 may also be provided with a third inverter 43 that outputs the first control signal S1 which is logically inverted from the reverse signal using the external power supply. Therefore, the control unit 40 can, for example, output the first control signal S1 at the high level when the detected voltage signal S is at the high level. Also, the control unit 40 can output the first control signal S1 at the low level when the detected voltage signal S is at the low level.

In this embodiment, the first inverter 41 is supplied with a voltage VDD of the external power supply. Additionally, the input terminal of the first inverter 41 is connected to the detected voltage signal S.

In this embodiment, the second inverter is supplied with a voltage V1 of the first internal power supply. In addition, the input terminal of the second inverter 42 is connected to the output terminal of the first inverter 41. Furthermore, the output terminal of the second inverter 42 is connected to the gate of the MOSFET 22b.

In this embodiment, the third inverter 43 is supplied with the voltage VDD of the external power supply. Additionally, the input terminal of the third inverter 43 is connected to the output terminal of the first inverter 41. Furthermore, the output terminal of the third inverter 43 is connected to the gate of MOSFET 22a.

In addition, the control unit 40 may also turn on the switch unit 22 (the first switch unit) connected between the first internal power supply (the internal power supply) and the ground according to the first control signal S1 and/or the second control signal S2, and thereby controls the discharging to the first internal power supply. In this case, the switch unit 22 is turned on according to the first control signal S1 and/or the second control signal S2, thereby forming a current path from the first internal power supply to the ground, so that the discharging operation to the first internal power supply can be performed.

In this embodiment, the control unit 40 outputs the first control signal S1 at the high level to the gate of the MOSFET 22a so as to turn on the MOSFET 22a, and thereby controls the discharging to the first internal power supply. Also, in this embodiment, the control unit 40 outputs the second control signal S2 at the high level to the gate of the MOSFET 22b so as to turn on the MOSFET 22b, and thereby controls the discharging to the first internal power supply.

The operation of the power supply control circuit in this embodiment is described with reference to FIG. 3. FIG. 3 (*a*) is a time-series chart showing the variation of the voltage V1 of the first internal power supply when the voltage VDD of the external power supply gradually decreases. FIG. 3 (*b*) is a time-series chart showing the variation of the voltage of the first control signal S1 and the second control signal S2 when the voltage VDD of the external power supply gradually decreases.

As shown in FIG. 3 (*a*), the first internal power supply generation unit 20 generates a certain voltage V1 used for driving circuits during the period that the external power supply provides a certain voltage VDD (>Vth). During this period, the voltage VDD is higher than the threshold voltage Vth, so the voltage detection unit 10 outputs the detected voltage signal S at the low level to the control unit 40.

Under these conditions, the MOSFET 22a of the first internal power supply generation unit 20 transits to the cut-off state due to the first control signal S1 at the low level which is outputted by the control unit 40 being applied to the gate. Additionally, when the detected voltage signal S at the low level has been inputted, the first inverter 41 of the control unit 40 outputs the reverse signal which is logically inverted from the low level to the high level. Furthermore, when the reverse signal at the high level has been inputted, the second inverter 42 of the control unit 40 outputs the second control signal S2 which is logically inverted from the high level to the low level. Under these conditions, the MOSFET 22b of the first internal power supply generation unit 20 transits to the cut-off state due to the second control signal S2 at the low level being applied to the gate. Therefore, since no current path is formed from the voltage V1 of the first internal power supply to the ground, the first internal power supply is supplied to other circuits.

The external power supply has been cut off at time t1, so the voltage VDD of the external power supply gradually decreases. The voltage VDD of the external power supply drops below the threshold voltage Vth at time t2, and the voltage detection unit 10 outputs the detected voltage signal S at the high level. When the voltage signal S at the high level is inputted, the first inverter 41 of the control unit 40 hereby outputs the reverse signal which is logically inverted from the high level to the low level. Additionally, the second inverter 42 of the control unit 40 outputs the second control signal S2 which is logically inverted from the low level to the high level when the reverse signal at the low level is inputted. Moreover, the voltage of the second control signal S2 is equal to the voltage V1 of the first internal power supply, as shown in FIG. 3 (b). Furthermore, the third inverter 43 of the control unit 40 outputs the first control signal S1 which is logically inverted from the low level to the high level when the reverse signal at the low level is inputted. Moreover, the voltage of the first control signal S1 is equal to the voltage VDD of the external power supply, as shown in FIG. 3 (b).

Under these conditions, the MOSFET 22a of the first internal power supply generation unit 20 transits to the conductive state due to the first control signal S1 at the high level being applied to the gate. Therefore, a current path is formed from the first internal power supply to the ground through the MOSFET 22a, and the first internal power supply discharges. Additionally, the MOSFET 22b transits to the conductive state due to the second control signal S2 at the high level being applied to the gate. Therefore, a current path is formed from the first internal power supply to the ground through the MOSFET 22b, and the first internal power supply discharges.

Figure 4:
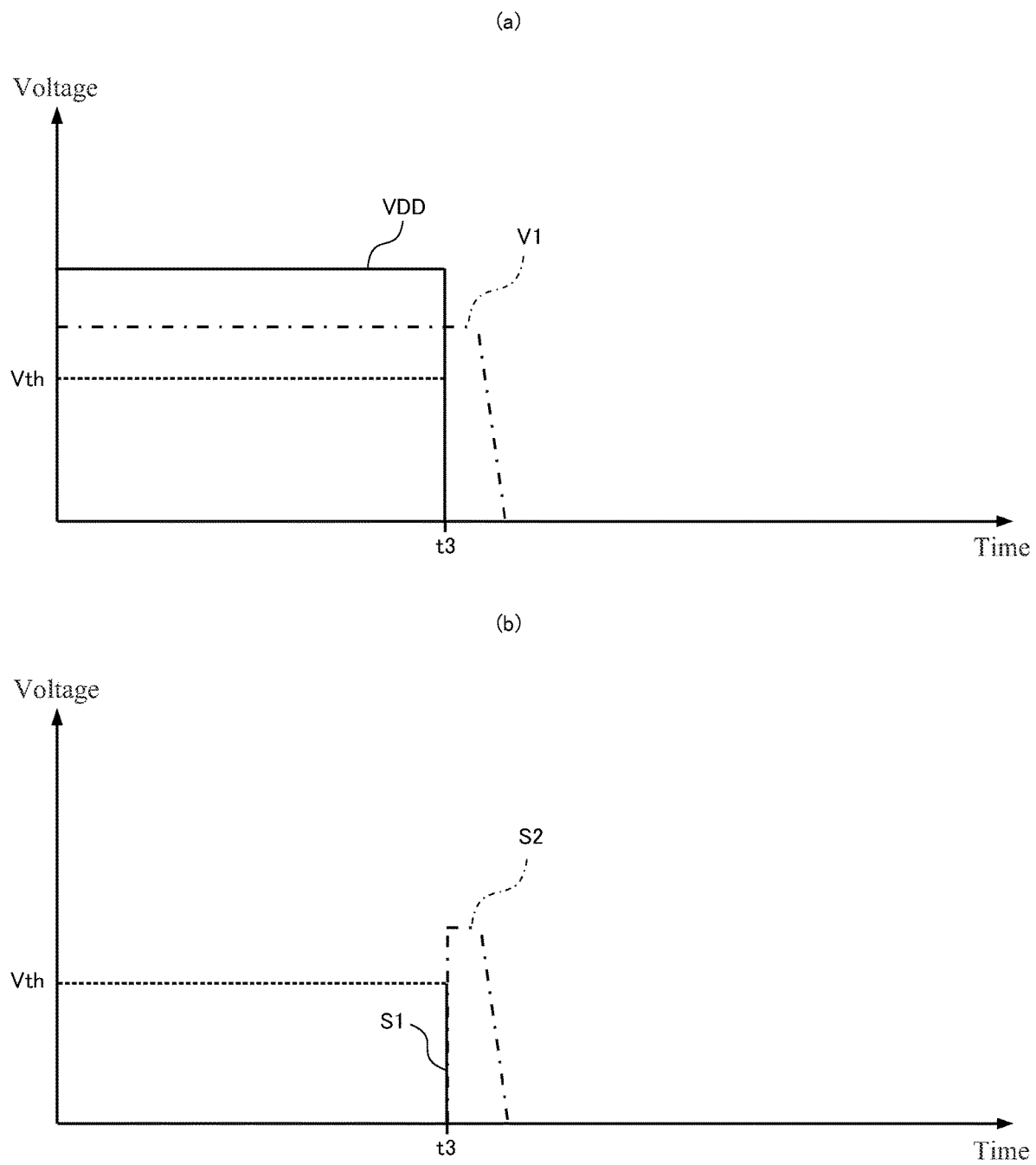
FIG. 4 (a) is a time-series chart showing the variation of the voltage of the first internal power supply when the voltage of the external power supply drops instantaneously.

The operation of the power supply control circuit in this embodiment when the voltage VDD of the external power supply instantaneously drops is described with reference to FIG. 4. FIG. 4 (a) is a time-series chart showing the variation of the voltage V1 of the first internal power supply when the voltage VDD of the external power supply instantaneously drops. FIG. 4 (b) is a time-series chart showing the variation of the voltage of the first control signal S1 and the second control signal S2 when the voltage VDD of the external power supply instantaneously drops.

Like the instance illustrated in FIG. 3, the voltage detection unit 10 outputs the detected voltage signal S at the low level during the period that the external power supply provides a certain voltage VDD (>Vth). Additionally, the control unit 40 outputs the first control signal S1 at the low level and the second control signal S2 at the low level. Therefore, the first internal power supply is supplied to other circuits without discharging.

The voltage VDD of the external power supply instantaneously drops to the ground level w % ben the external power supply is cut off at time t3. At this moment, the voltage detection unit 10 outputs the detected voltage signal S at the high level at time t3, but this detected voltage signal S transits from the high level to the low level, and remains at the low level.

On the other hand, the first inverter 41 of the control unit 40 logically inverts the detected voltage signal S at the low level, and outputs the result as the reverse signal at the high level. The voltage of the reverse signal hereby is equal to the voltage VDD (ground level) of the external power supply, so the signal at the low level is inputted into the second inverter 42. Then, the second inverter 42 logically inverts the reverse signal at the low level, and outputs the result as the second control signal S2 at the high level. The voltage of the second control signal S2 hereby is equal to the voltage V1 of the first internal power supply, as shown in FIG. 4 (b). Moreover, the first control signal S1 outputted from the third inverter 43, as shown in FIG. 4 (b), transits to the high level at time t3, but just like the detected voltage signal S, it transits to the low level immediately and remains at the low level.

The MOSFET 22b of the first internal power supply generation unit 20 transits to the conductive state due to the second control signal S2 at the high level being applied to the gate. Therefore, during the period that the second control signal S2 is at the high level (before the first internal power supply runs out of power), a current path is formed from the first internal power supply to the ground through the MOSFET 22b, and the first internal power supply discharges.

As described above, the power supply control circuit according to this embodiment discharges to the first internal power supply according to the second control signal S2 with the voltage V1 of the first internal power supply (the internal power supply), and thus for example, even when the external power supply is instantaneously cut off, discharging to the first internal power supply according to the second control signal S2 is allowed before the first internal power supply runs out of power. Therefore, reliably discharging to the first internal power supply is allowed even when the external power supply is instantaneously cut off.

The second embodiment of the present disclosure is described as follows. The power supply control circuit in this embodiment is different from the first embodiment in terms of discharging to the second internal power supply. The structure that is different from the first embodiment is described as follows.

Figure 5:
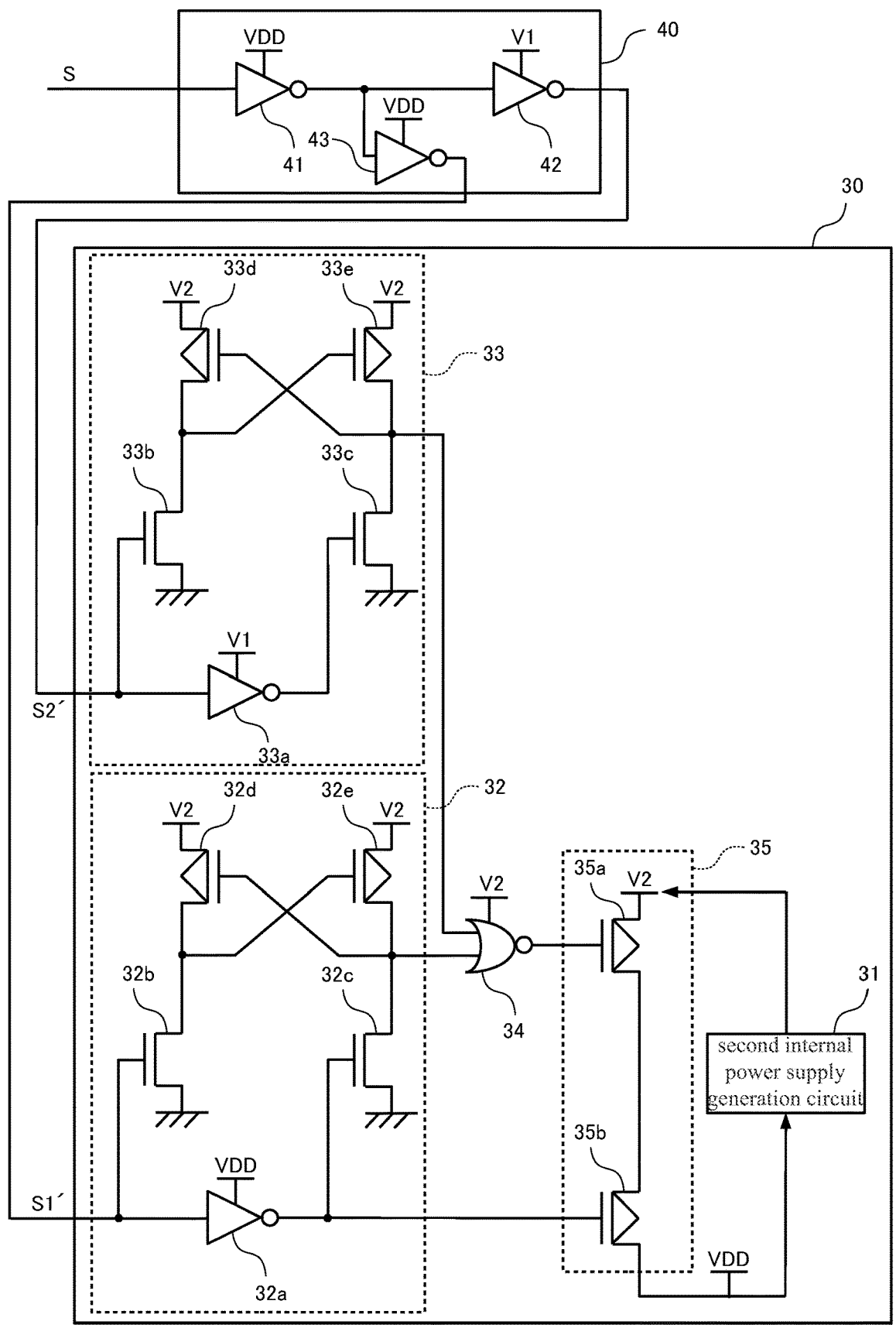
FIG. 5 is a schematic diagram showing a structural example of the second internal power supply generation unit and the control unit in the power supply control circuit in the second embodiment of the present disclosure.

FIG. 5 is a schematic diagram showing a structural example of the second internal power supply generation unit 30 and the control unit 40 in the power supply control circuit in this embodiment of the present disclosure. The second internal power supply generation unit 30 may also be provided with a second internal power supply generation circuit 31 which generates the second internal power supply according to the external power supply, a first level shift circuit 32, a second level shift circuit 33, a NOR circuit 34, and a switch unit 35 which is connected between the second internal power supply (the internal power supply) and the external power supply. Moreover, the switch unit 35 is an example of the "second switch unit" in the present disclosure.

The second internal power supply generation circuit 31 may also, for example, supplies the second internal power supply which is generated by increasing the voltage VDD to the voltage V2 using a charge pump to other circuits. Additionally, the second internal power supply generation circuit 31 may also be composed of conventional internal power supply generation circuits.

The first level shift circuit 32 includes a inverter 32a which is supplied with a voltage VDD of the external power supply, two N-type MOSFETs 32b and 32c, two P-type MOSFETs 32d and 32e.

The drain of the MOSFET 32b is connected to the output voltage V2 of the second internal power supply through the drain-source of the MOSFET 32d and is connected to the gate of the MOSFET 32e. Additionally, the gate of the MOSFET 32b is connected to the input terminal of the inverter 32a and the output terminal of the third inverter 43 of the control unit 40. Therefore, the gate of the MOSFET 32b and the input terminal of the inverter 32a are each applied with the first control signal S1' outputted by the control unit 40 respectively. The voltage of first control signal S1' is equal to the voltage VDD of the external power supply. Furthermore, the source of the MOSFET 32b is connected to the ground.

The drain of the MOSFET 32c is connected to the output voltage V2 of the second internal power supply through the drain-source of the MOSFET 32e. The drain of the MOSFET 32c is also connected to the gate of the MOSFET 32d and to an input terminal of the NOR circuit 34. Additionally, the gate of the MOSFET 32c is connected to the output terminal of the inverter 32a and to the gate of the MOSFET 35b of the switch circuit 35 (which is described later). Furthermore, the source of the MOSFET 32c is connected to the ground.

The second level shift circuit 33 includes an inverter 33a which is supplied with the voltage V1 of the first internal power supply, two n-type MOSFETs 33b and 33c, and two P-type MOSFET 33d and 33e.

The drain of the MOSFET 33b is connected to the output voltage V2 of the second internal power supply through the drain-source of the MOSFET 33d and is connected to the gate of the MOSFET 33e. Additionally, the gate of the MOSFET 33b is connected to the input terminal of the inverter 33a and the output terminal of the second inverter 42 of the control unit 40. Therefore, the gate of the MOSFET 33b and the input terminal of the inverter 33a are each applied with the second control signal S2' which is outputted by the control unit 40 respectively. The voltage of the second control signal S2' is equal to the voltage V1 of the first internal power supply. Furthermore, the source of the MOSFET 33b is connected to the ground.

The drain of the MOSFET 33c is connected to the output voltage V2 of the second internal power supply through the drain-source of the MOSFET 33e. The drain of the MOSFET 33c is also connected to the gate of the MOSFET 33d and an input terminal of the NOR circuit 34. Additionally, the gate of the MOSFET 33c is connected to the output terminal of the inverter 33a. Furthermore, the source of the MOSFET 33c is connected to the ground.

The NOR circuit 34 is supplied with a voltage V2 of the second internal power supply. Additionally, the output terminal of the NOR circuit is connected to the gate of the MOSFET 35a of the switch unit 35 (which is described later).

The switch unit 35 may also be provided with a P-type MOSFET 35a that is turned on by the input of the first control signal S1' and/or the second control signal S2' when the voltage VDD of the external power supply drops below the threshold voltage Vth (the predetermined value). Therefore, a current path from the second internal power supply to the external power supply through the MOSFET 35a can be formed by the input of the first control signal S1' and/or the second control signal S2' when the voltage VDD of the external power supply drops below the threshold voltage Vth. Moreover, the MOSFET 35a is an example of the "third transistor" of the present disclosure.

In addition, the switch unit 35 may also be provided with a P-type MOSFET 35b that is turned on when the voltage VDD of the external power supply drops below the threshold voltage Vth (the predetermined value) or when the external power supply is cut off (when the voltage VDD of the external voltage is at the ground level). Furthermore, the MOSFET 35a and the MOSFET 35b may also be connected in series between the second internal power supply (the internal power supply) and the external power supply. Therefore, a current path from the second internal power supply to the external power supply through the MOSFET 35a and the MOSFET 35b can be formed when the voltage VDD of the external power supply drops below the threshold voltage Vth or when the external power supply is cut off. Moreover, the MOSFET 35b is an example of the "fourth transistor" in the present disclosure.

In this embodiment, the source of the MOSFET 35a is connected to the output voltage V2 of the second internal power supply generation circuit 31. Additionally, the drain of the MOSFET 35a is connected to the output voltage VDD of the external power supply through the drain-source of the MOSFET 35b. Moreover, the position of the MOSFET 35a and the MOSFET 35b can be exchanged.

The control unit 40 may also turn on the switch unit 35 (the second switch unit) between the second internal power supply (the internal power supply) and the external power supply according to the first control signal S1' and/or the second control signal S2', and controls the discharging to the second internal power supply. Under these conditions, a current path from the second internal power supply to the external power supply can be formed by turning on the switch unit 35 according to the first control signal S1' and/or the second control signal S2', so that discharging to the second internal first power supply is allowed.

In this embodiment, the control unit 40 outputs the first control signal S1' at the high level to the first level shift circuit 32, and turn on the MOSFET 35a and the MOSFET 35b of the switch unit 35, thereby controlling the discharge to the second internal power supply. Additionally, the control unit 40 in this embodiment outputs the second control signal S2' at the high level to the second level shift circuit 33, and turn on the MOSFET 35a of the switch 35. Thereby controlling the discharge to the second internal power supply.

Figure 6:
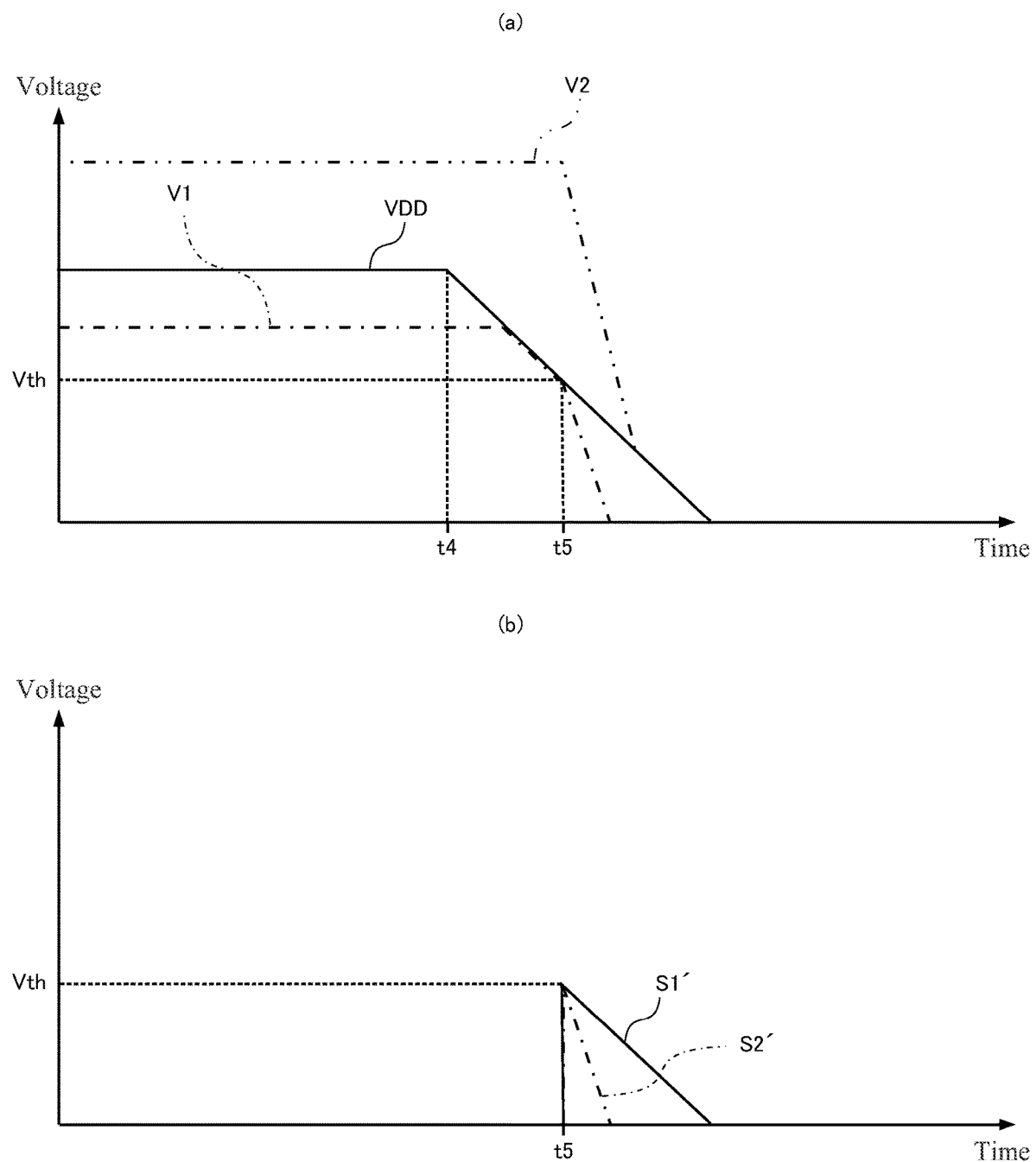
FIG. 6 (a) is a time-series chart showing the variation of the voltage of the first internal power supply and the second internal power supply when the voltage of the external power supply gradually decreases.

The operation of the power supply control circuit in this embodiment is described with reference to FIG. 6. FIG. 6 (a) is a time-series chart showing the variation of voltage V1 and voltage V2 of the first internal power supply and the second internal power supply when the voltage VDD of the external power supply gradually decreases. FIG. 6 (b) is a time-series chart showing the variation of the voltage of the first control signal S1' and the second control signal S2' when the voltage VDD of the external power supply gradually decreases.

Considering that the variation of the voltage V1 of the first internal power supply is identical to the first embodiment as described previously, only the variation of the voltage V2 of the second internal power supply is described hereby.

As shown in FIG. 6(a), the second internal power supply generation unit 30 generates a certain voltage V2 used for driving the circuits during the period that the external power supply provides a certain voltage VDD (>Vth). During this period, the voltage VDD is higher than the threshold voltage Vth, so the voltage detection unit 10 outputs the detected voltage signal S at the low level to the control unit 40.

Under these conditions, the control unit 40 outputs the first control signal S1' at the low level and the second control signal S2' at the low level, which is similar to the first embodiment. At this moment, the inverter 32*a* of the first level shift circuit 32 of the second internal power supply generation unit 30 will output the reverse signal that is logically inverted from the first control signal S1' after outputting the first control signal S1'. Therefore, the MOSFET 35*b* of the switch 35 of the second internal power supply generation unit 30 transits to the cut-off state due to the inverter 32*a* applying the signal that is logically inverted from the low level to the high level to the gate.

In addition, in the first level shift circuit 32 of the second internal power supply generation unit 30, the MOSFET 32*b* transits to the cut-off state and the MOSFET 32*c* transits to the conductive state when the first control signal S1' is at the low level. Under these conditions, the first level shift circuit 32 outputs the signal at the low level to the NOR circuit 34. Moreover, the specific operation the first level shift circuit 32 may also be the same as conventional level shift circuits.

On the other hand, in the second level shift circuit 33 of the second internal power supply generation unit 30, the MOSFET 33*b* transits to the cut-off state and the MOSFET 33*c* transits to the conductive state when the second control signal S2' is at the low level. Under these conditions, the second level shift circuit 33 outputs the signal at the low level to the NOR circuit 34. Moreover, the specific operation of the second level shift circuit 33 may also be the same as conventional level shift circuits. Then, the MOSFET 35*a* of the switch unit 35 of the second internal power supply generation unit 30 transits to the cut-off state due to the signal at the high level as a result of the logical calculation by the NOR circuit 34 being applied to the gate.

Therefore, since no current path is formed from the voltage V2 of the second internal power supply to the voltage VDD of the external power supply through the MOSFET 35*a* and 35*b*, the second internal power supply will be supplied to other circuits.

The external power supply has been cut off at time t4, so the voltage VDD of the external power supply gradually decreases. When the voltage VDD of the external power supply drops below the threshold voltage Vth at time t5, the voltage detection unit 10 outputs the detected voltage signal S at the high level. Additionally, the control unit 40 outputs the first control signal S1' at the high level and the second control signal S2' at the high level, which is similar to the first embodiment. The voltage of the first control signal S1' hereby is equal to the voltage VDD of the external power supply, as shown in FIG. 6 (*b*). Additionally, the voltage of the second control signal S2' is equal to the voltage V1 of the first internal power supply, as shown in FIG. 6 (*b*).

Under these conditions, the inverter 32*a* of the first level shift circuit 32 of the second internal power supply generation unit 30 outputs the reverse signal that is logically inverted from the first control signal S1' after the first control signal S1' is inputted. Therefore, the MOSFET 35*b* of the switch unit 35 of the second internal power supply generation unit 30 transits to the conductive state due to the inverter 32*a* applying the signal that is logically inverted from the high level to the low level to the gate.

In addition, in the first level shift circuit 32 of the second internal power supply generation unit 30, the MOSFET 32*b* transits to the conductive state and the MOSFET 32*c* transits to the cut-off state when the first control signal S1' is at the high level. Under these conditions, the first level shift circuit 32 outputs the signal at the high level to the NOR circuit 34. On the other hand, in the second level shift circuit 33 of the second internal power supply generation unit 30, the MOSFET 33*b* transits to the conductive state and the MOSFET 33*c* transits to the cut-off state when the second control signal S2' is at the high level. Under these conditions, the second level shift circuit 33 outputs the signal at the high level to the NOR circuit 34. Then, the MOSFET 35*a* of the switch 35 of the second internal power supply generation unit 30 transits to the conductive state due to the signal at the low level as a result of the logical calculation by the NOR circuit 34 being applied to the gate.

Therefore, a current path is formed from the voltage V2 of the second internal power supply to the voltage VDD of the external power supply through the MOSFET 35*a* and 35*b*, and the second internal power supply discharges (the voltage V2 of the second internal power supply and the voltage VDD of the external power supply will decrease to the ground level together).

Figure 7:
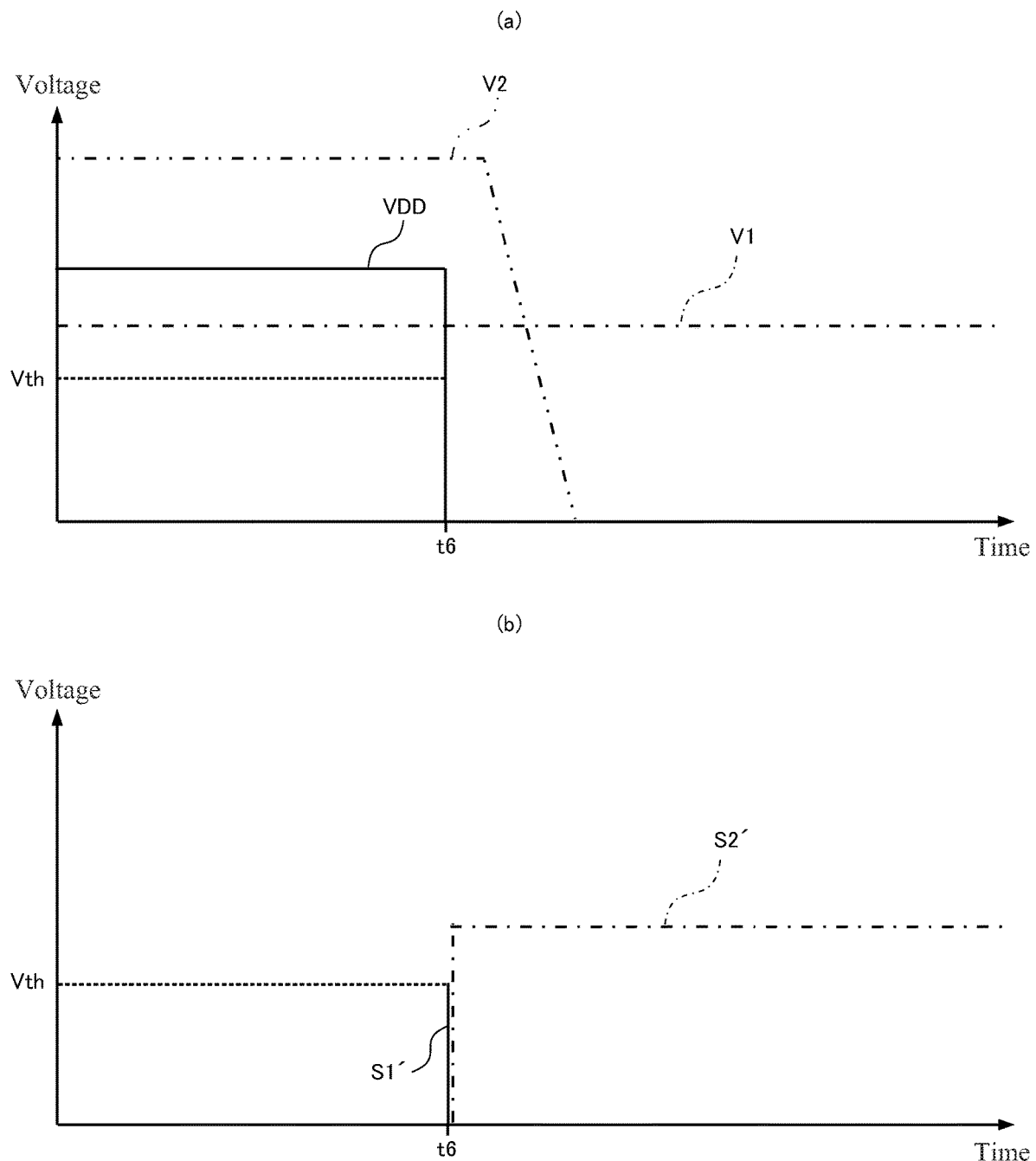
FIG. 7 (a) is a time-series chart showing the variation of the voltage of the first internal power supply and the second internal power supply w % ben the voltage of the external power supply drops instantaneously.

The operation of the power supply control circuit in this embodiment when the voltage VDD of the external power supply instantaneously drops is described with reference to FIG. 7. FIG. 7 (*a*) is a time-series chart showing the variation of the voltage V1 and the voltage V2 of the first internal power supply and the second internal power supply respectively when the voltage VDD of the external power supply drops instantaneously. FIG. 7 (*b*) is a time-series chart showing the variation of the voltage of the first control signal S1' and the second control signal S2' when the voltage VDD of the external power supply drops instantaneously.

The instance of discharging to the second internal power supply in the first internal power supply and the second internal power supply is described as an example hereby.

Like the instance illustrated in FIG. 6, the voltage detection unit 10 outputs the detected voltage signal S at the low level during the period that the external power supply provides a certain voltage VDD (>Vth). Additionally, the control unit 40 outputs the first control signal S1' at the low level and the second control signal S2' at the low level. Therefore, the second internal power supply does not discharge to other circuits.

The voltage VDD of the external power supply instantaneously drops to the ground level when the external power supply is cut off at time t6. At this moment, the voltage detection unit 10 outputs the detected voltage signal S at the high level at time t6, but this detected voltage signal S switches from the high level to the low level immediately, and remains at the low level.

Under these conditions, the control unit 40 outputs the second control signal S2' at the high level, which is similar to the first embodiment. The second control signal S2' hereby is equal to the voltage V1 of the first internal power supply. Additionally, the control unit 40 outputs the first control signal S1' at the low level.

The inverter 32*a* of the first level shift circuit 32 of the second internal power supply generation unit 30 outputs the reverse signal at the high level that is logically inverted from the first control signal S1' when the first control signal S1' at the low level is inputted. The voltage of this reverse signal hereby is equal to the voltage VDD of the external power supply (the ground level), so the signal at the low level is applied to the gate of the MOSFET 35*b* of the switch unit 35. Therefore, the MOSFET 35*b* transits to the conductive state.

In addition, in the first level shift circuit 32 of the second internal power supply generation unit 30, the MOSFET 32*b* transits to the cut-off state and the MOSFET 32*c* transits to the conductive state when the first control signal S1' is at the low level. Under these conditions, the first level shift circuit 32 outputs the signal at the low level to the NOR circuit 34. On the other hand, in the second level shift circuit 33 of the second internal power supply unit, the MOSFET 33b transits to the conductive state and the MOSFET 33c transits to the cut-off state when the second control signal S2' is at the high level. Under these conditions, the second level shift circuit 33 outputs the signal at the high level to the NOR circuit 34. Then, the MOSFET 35a of the switch unit 35 of the second internal power supply generation unit 30 transits to the conductive state due to the signal at the low level as a result of the logical calculation by the NOR circuit 34 being applied to the gate.

Therefore, a current path is formed from the voltage V2 of the second internal power supply to the voltage VDD of the external power supply through the MOSFET 35a and 35b, and the second internal power supply discharges (the voltage V2 of the second internal power supply and the voltage VDD of the external power supply will decrease to the ground level together).

As described above, the power supply control circuit according to this embodiment discharges to the second internal power supply according to the second control signal S2' with the voltage V1 of the first internal power supply (the internal power supply), and thus for example, even when the external power supply is instantaneously cut off, discharging to the second internal power supply according to the second control signal S2' is allowed before the first internal power supply runs out of power. Therefore, reliably discharging to the second internal power supply is allowed even when the external power supply is instantaneously cut off.

The third embodiment of the present disclosure is described as follows. The power supply control circuit in this embodiment is different from the first embodiment and the second embodiment in terms of discharging to the first internal power supply and the second internal power supply. The structure that is different from the first embodiment is described as follows.

Figure 8:
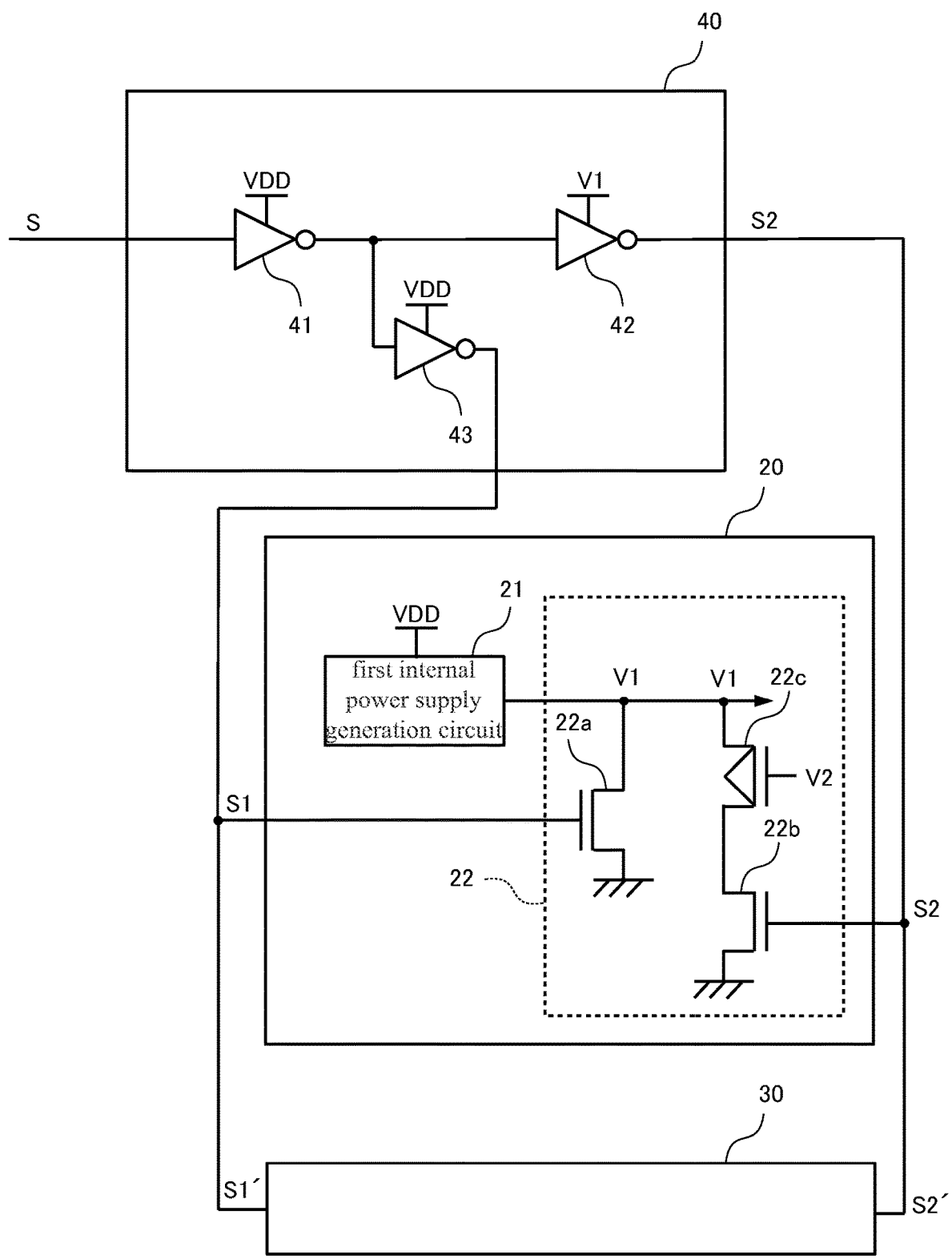
FIG. 8 is a schematic diagram showing the structural example of the first internal power supply generation unit, the second internal power supply generation unit, and the control unit of the power supply control circuit in the third embodiment of the present disclosure.

FIG. 8 is a schematic diagram showing the structural example of the first internal power supply generation unit 20, the second internal power supply generation unit 30, and the control unit 40 of the power supply control circuit in the third embodiment of the present disclosure.

In this embodiment, the control unit 40 can control the discharging to the first internal power supply and the second internal power supply according to at the second control signal S2, S2' among the first control signal S1, S1', and the second control signal S2, S2' when the voltage VDD of the detected external power decreases to the threshold voltage Vth (the predetermined value).

In addition, the second internal power supply in this embodiment may have a voltage V2 that is higher than the voltage V1 of the first internal power supply. Under these conditions, discharging to the first internal power supply and the second internal power supply according to the second control signal S2 and S2' respectively, even when each voltage V1 and the voltage V2 of the first internal power supply and the second internal power supply are different.

It is possible for the second internal power supply to stop discharging (before the second internal power supply runs out of power) because the first internal power supply stops discharging before the second internal power supply does (e.g., the second control signal S2 and S2' transits to the low level before the voltage V2 of the second internal power supply decreases to the ground level) when the voltage of the second control signal S2 and S2' is the same as the voltage V1 of the first internal power supply. Therefore, the control unit 40 may also control the first internal power supply to stop discharging after the second internal power supply does. Therefore, discharging to the first internal power supply and the second internal power supply according to the second control signal S2 and S2' respectively is allowed, even when the voltage of second control signal S2 and S2' is equal to the voltage V1 of the first internal power supply.

In this embodiment, the switch unit 22 of the first internal power supply unit 20 may also be provided with a P-type MOSFET 22c that transits to the conductive state when the voltage V2 of the second internal power supply is lower than the voltage V1 of the first internal power supply, and an N-type MOSFET 22b that transits to the conductive state due to the input of the second control signal S2 and S2' when the voltage VDD of the external power supply decrease below the threshold voltage Vth (the predetermined value). Additionally, the MOSFET 22c and the MOSFET 22b can also be connected in series between the first internal power supply and the external power supply. Therefore, a current path from the first internal power supply to the ground through the MOSFET 22c and the MOSFET 22b is formed due to the input of the second control signal S2 and S2', when the voltage VDD of the external power supply decreases below the threshold voltage Vth and the voltage V2 of the second internal power supply is lower than the voltage V1 of the first internal power supply. Therefore, the first internal power supply is allowed to stop discharging after the second internal power supply does. Moreover, the MOSFET 22c is an example of the "fifth transistor" of the present disclosure, and the MOSFET 22b is an example of the "sixth transistor" of the present disclosure.

In this embodiment, the drain of the MOSFET 22b is connected to the output voltage V1 of the first internal power supply generation unit 21 through the drain-source of the MOSFET 22c. Additionally, the source of the MOSFET 22b is connected to the ground. Furthermore, the gate of the MOSFET 22b is applied with the second control signal S2. Additionally, the gate of the MOSFET 22c is connected to the output voltage V2 of the second internal power generation unit 30. Moreover, the position of the MOSFET 22b and the MOSFET 22c can be exchanged.

Figure 9:
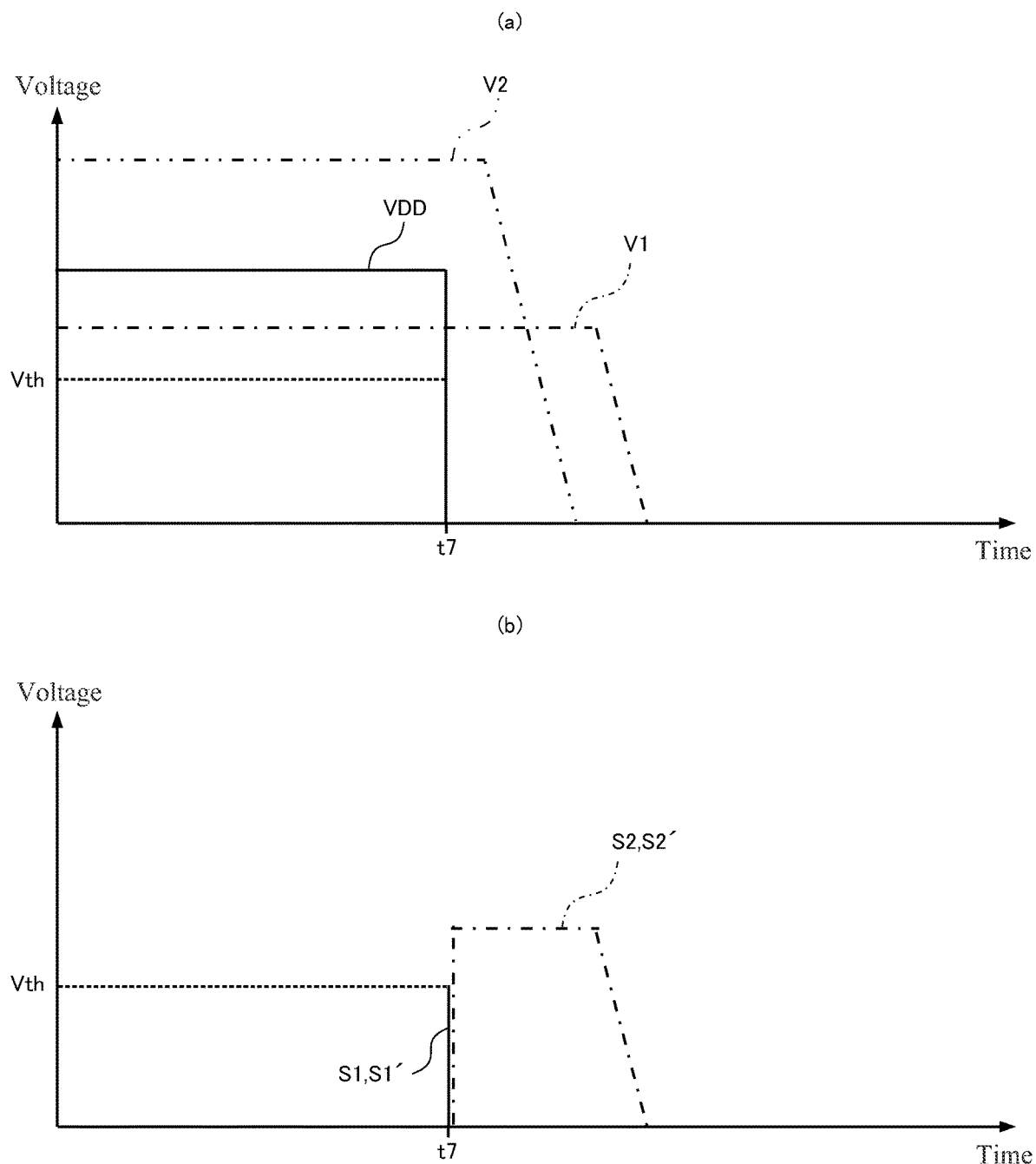
FIG. 9 (a) is a time-series chart showing the variation of the voltage of the first internal power supply and the second internal power supply when the voltage of the external power supply drops instantaneously.

The operation of the power supply control circuit is described with reference to FIG. 9. FIG. 9 (a) is a time-series chart showing the variation of each voltage V1 and V2 of the first internal power supply and the second internal power supply when the voltage VDD of the external power supply drops instantaneously. FIG. 9 (b) is a time-series chart showing the variation of the voltage of each first control signal S1 and S1' and each second control signal S2 and S2' when the voltage VDD of the external power supply drops instantaneously.

The variation of the voltage V1 and V2 of the first internal power supply and the second internal power supply when the voltage VDD of the external power supply gradually decreases is identical to each of the embodiments described previously.

Just like each of the embodiments described previously, the voltage detection unit 10 outputs the detected voltage signal S at the low level during the period that the external power supply provides a certain voltage VDD (>Vth). Additionally, the control unit 40 outputs the first control signal S1 and S1' at the low level and the second control signal S2 and S2' at the low level. Therefore, the first internal power supply and the second internal power supply does not discharge to other circuits.

The voltage VDD of the external power supply drops instantaneously to the ground level. At this moment, the voltage detection unit 10 outputs the detected voltage signal S at the high level at time t7, but this detected voltage signal S immediately transits from the high level to the low level and remains at the low level.

Under these conditions, the control unit 40 outputs the second control signal S2 and ST at the high level. The voltage of the second control signal S2 and S2' hereby is the same as the voltage V1 of the first internal power supply. Additionally, the control unit 40 outputs the first control signal S1 and S1' at the low level.

In the first internal power supply generation unit 20, the MOSFET 22a of the switch unit 22 transits to the cut-off state due to the first control signal S1 at the low level being applied to the gate. Additionally, the MOSFET 22b transits to the conductive state due to the second control signal S2 at the high level being applied to the gate. On the other hand, since the voltage V2 of the second internal power supply is higher than the voltage V1 of the first internal power supply, the signal at the high level is applied to the gate. Therefore, the MOSFET 22c transits to the cut-off state. As such, since no current path is formed from the voltage V1 of the first internal power supply to the ground, the first internal power supply will supply power to other circuits.

In the second internal power supply generation unit 30, a current path is formed from the voltage V2 of the second internal power supply to the voltage VDD of the external power supply through the MOSFET 35a and the MOSFET 35b, which is similar to the second embodiment described previously. Therefore, the second internal power supply discharges.

The MOSFET 22c of the switch unit 22 of the first internal power supply generation unit 20 transits to the conductive state due to the signal at the low level being applied to the gate, when the voltage V2 of the second internal power supply becomes lower than the voltage V1 of the first internal power supply due to the second internal power supply discharging. Therefore, a current path is formed from the voltage V1 of the first internal power supply to the ground through the MOSFET 22b and the MOSFET 22c, and power is discharged to the first internal power supply.

As such, the discharging of the first internal power supply is performed when the voltage V2 of the second internal power supply is lower than the voltage V1 of the first internal power supply, so the first internal power supply can stop discharging after the second internal power supply does.

As described above, according to the power supply control circuit of this embodiment, the first internal power and the second internal power discharges according to the second control signal S2 and S2', so it is permitted to discharge to the first internal power supply and the second internal power supply according to the second control signal S2 and S2', respectively, before the first internal power supply and the second internal power supply run out of power, even when the external power supply is cut off instantaneously.

The embodiments described previously are recited to make the present disclosure easy to understand, and the recitation does not limit the present disclosure. Therefore, the elements disclosed in the embodiments are incorporated with all variations or equivalents that fall under the technical scope of the present disclosure.

For example, in the embodiments described previously, an instance in which the second control signal S2 and S2' have the voltage V1 of the first internal power supply is discussed, but the present disclosure is not limited thereto. For example, the second control signal S2 and S2' may also have the voltage V2 of the second internal power supply.

In addition, in the embodiments described previously, an instance in which the power supply control circuit is provided with the first internal power supply generation unit 20 and the second internal power supply generation unit 30 is discussed, but the present disclosure is not limited thereto. For example, the power supply control unit may also be provided with the first internal power supply generation unit 20 or the second internal power supply generation unit 30.

Furthermore, in the third embodiment, an instance in which the control unit 40 controls the first internal power supply to stop discharging after the second internal power supply does is discussed, but the present disclosure is not limited thereto. For example, the control unit 40 may also control the second internal power supply to stop discharging after the first internal power supply does, and may also control the first internal power supply and the second internal power supply to discharge individually.

Furthermore, in the embodiments described previously, an instance in which the first internal power supply and the second internal power supply are directly generated by the external power supply is discussed, but the present disclosure is not limited thereto. For example, the power supply control circuit may also be provided with a base power supply generation unit for generating a base power supply with a predetermined base voltage. Under these conditions, the first internal power supply generation unit 20 may also generate the first internal power supply according to the base power supply. Additionally, the second internal power supply generation unit 30 may also generate the second internal power according to the base power supply.

In addition, in the embodiments described previously, an instance in which the first control signal S1 and S1' of the detected voltage signal S that is outputted according to the voltage detection unit 10 are outputted from the control unit 40 to the first internal power supply generation unit 20 and the second internal power supply generation unit 30 is discussed, but the present disclosure is not limited thereto. For example, the first control signal S1 and S1' mat also be outputted directly from the voltage detection unit 10 to the first internal power supply generation unit 20, the second internal power supply generation unit 30, and the control unit 40.

In addition, in the embodiments described previously, an instance in which the single second inverter 42 of the control unit 40 outputs the second control signal S2 and S2' is discussed, but the present disclosure is not limited thereto. For example, the control unit 40 may be provided with individual second inverter 42 for each of the second control signals S2 and S2'.

Furthermore, in the embodiments described previously, an instance in which the MOSFET 22a, 22b, 22c, 35a, and 35b are the "first transistor" to the "sixth transistor" respectively is discussed, but the present disclosure is not limited thereto. For example, other transistors can be used to replace the MOSFET, and other switch components can also be used.

Furthermore, in the embodiments described previously, an instance in which the first internal power supply generation unit 20 and the second internal power supply generation unit 30 generate a positive voltage (a voltage higher than the ground level) (i.e., the first control signal S1, S1' and the second control signal S2, S2 have the positive voltage) is discussed, but the present disclosure is not limited thereto. For example, at least one of the first internal power supply generation unit 20 and the second internal power supply generation unit 30 may also generates a negative voltage (a voltage lower than the ground level). The control unit 40 hereby controls the discharging of power to the internal power supplies (the first internal power supply and/or the second internal power supply) according to at least the second control signal S2 and S2', even when at least one of the first control signal S1, S1', and the second control signal S2, S2' has a negative voltage.

Furthermore, in the embodiments described previously, an instance in which the second internal power supply has a voltage V2 that is higher than the first internal power supply is discussed, but the present disclosure is not limited thereto. For example, the voltage V2 of the second internal power supply can also be equal to the voltage V1 of the first internal power supply.

What is claimed is:

1. A power supply control circuit, comprising:
    a voltage detection unit, detecting voltage of an external power supply;
    an internal power supply generation unit, generating an internal power supply according to the external power supply; and
    a control unit, controlling discharging to the internal power supply according to at least a second control signal among a first control signal with the voltage of the external power supply and the second control signal with the voltage of the internal power supply.

2. The power supply control circuit as claimed in claim 1, wherein the control unit comprises:
    a first inverter, using the external power supply to output a reverse signal that is logically inverted from a signal with the voltage of the external power supply; and
    a second inverter, using the internal power supply to output the second control signal that is logically inverted from the reverse signal.

3. The power supply control circuit as claimed in claim 1, wherein the control unit turns on a first switch unit according to the first control signal and/or the second control signal, and thereby the control unit controls the discharging to the internal power supply, the first switch unit is connected between the internal power supply and a ground.

4. The power supply control circuit as claimed in claim 2, wherein the control unit turns on a first switch unit according to the first control signal and/or the second control signal, and thereby the control unit controls the discharging to the internal power supply, the first switch unit is connected between the internal power supply and a ground.

5. The power supply control circuit as claimed in claim 3, wherein the first switch unit is provided with a first transistor that is connected between the internal power supply and the ground, and the first transistor is turned on due to the input of the second control signal when the voltage of the external power supply decreases below a predetermined value.

6. The power supply control circuit as claimed in claim 4, wherein the first switch unit is provided with a first transistor that is connected between the internal power supply and the ground, and the first transistor is turned on due to the input of the second control signal when the voltage of the external power supply decreases below a predetermined value.

7. The power supply control circuit as claimed in claim 5, wherein the first switch unit is provided with a second transistor that is connected between the internal power supply and the ground, and the second transistor is turned on due to the input of the first control signal when the voltage of the external power supply drops below the predetermined value.

8. The power supply control circuit as claimed in claim 6, wherein the first switch unit is provided with a second transistor that is connected between the internal power supply and the ground, and the second transistor is turned on due to the input of the first control signal when the voltage of the external power supply drops below the predetermined value.

9. The power supply control circuit as claimed in claim 1, wherein the control unit turns on a second switch unit according to the first control signal and/or the second control signal, and thereby the control unit controls the discharging to the internal power supply, the second switch unit is connected between the internal power supply and the external power supply.

10. The power supply control circuit as claimed in claim 9, wherein the second switch unit is provided with a third transistor, and the third transistor is turned on due to the input of the first control signal and/or the second control signal when the voltage of the third transistor drops below a predetermined value.

11. The power supply control circuit as claimed in claim 10, wherein the second switch unit is provided with a fourth transistor, and the fourth transistor is turned on when the voltage of the external power supply drops below the predetermined value;
    wherein the third transistor and the fourth transistor are connected in series between the internal power supply and the external power supply.

12. The power supply control circuit as claimed in claim 1, wherein the internal power supply generation unit is provided with:
    a first internal power supply generation unit, generating a first internal power supply according to the external power;
    a second internal power supply, generating a second internal power supply according to the external power;
    wherein the control unit controls the discharging to the first internal power supply and the second internal power supply according to at least the second control signal among the first control signal and the second control signal, when the detected voltage of the external power supply drops below the predetermined value.

13. The power supply control circuit as claimed in claim 12, wherein the voltage of the second internal power supply is higher than the voltage of the first internal power supply.

14. The power supply control circuit as claimed in claim 12, wherein the control unit controls the first internal power supply to stop discharging after the second internal power supply stops discharging.

15. The power supply control circuit as claimed in claim 13, wherein the control unit controls the first internal power supply to stop discharging after the second internal power supply stops discharging.

16. The power supply control circuit as claimed in claim 14, wherein the control unit turns on a third switch unit according to the second control signal, and thereby the control unit controls the discharging to the first internal power supply, the third switch unit is connected between the first internal power supply and a ground, and the third switch unit is provided with:
    a fifth transistor, being turned on when the voltage of the second internal power supply is lower than the voltage of the first internal power supply; and
    a sixth transistor, being turned on when the second control signal is imputed, and the voltage of the external power supply drops below the predetermined value;

wherein the fifth transistor and the sixth transistor are connected in series between the first internal power supply and the ground.

17. The power supply control circuit as claimed in claim 15, wherein the control unit turns on a third switch unit according to the second control signal, and thereby the control unit controls the discharging to the first internal power supply, the third switch unit is connected between the first internal power supply and a ground, and the third switch unit is provided with:
- a fifth transistor, being turned on when the voltage of the second internal power supply is lower than the voltage of the first internal power supply; and
- a sixth transistor, being turned on when the second control signal is imputed, and the voltage of the external power supply drops below the predetermined value;
- wherein the fifth transistor and the sixth transistor are connected in series between the first internal power supply and the ground.

* * * * *